United States Patent
Heinle (10) Patent No.: US 6,525,805 B2
(45) Date of Patent: Feb. 25, 2003

(54) BACKSIDE ALIGNMENT SYSTEM AND METHOD

(75) Inventor: Konrad Heinle, Santa Clara, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/855,486

(22) Filed: May 14, 2001

(65) Prior Publication Data

US 2002/0167649 A1 Nov. 14, 2002

(51) Int. Cl.[7] .......................... G03B 27/42; G01B 11/00
(52) U.S. Cl. .......................... 355/53; 356/400; 356/401
(58) Field of Search .................... 355/53; 356/399, 356/400, 401

(56) References Cited

U.S. PATENT DOCUMENTS

| | | | | |
|---|---|---|---|---|
| 3,752,589 A | | 8/1973 | Kobayashi | 356/172 |
| 4,897,553 A | * | 1/1990 | Nishi | 250/548 |
| 4,952,060 A | * | 8/1990 | Ina et al. | 356/400 |
| 4,952,815 A | * | 8/1990 | Nishi | 250/548 |
| 5,241,188 A | * | 8/1993 | Mizutani | 250/548 |
| 5,552,892 A | * | 9/1996 | Nagayama | 250/548 |
| 5,621,813 A | | 4/1997 | Brown et al. | 382/151 |
| 5,821,549 A | | 10/1998 | Talbot et al. | 250/307 |
| 5,843,831 A | | 12/1998 | Chung et al. | 438/401 |
| 5,874,190 A | * | 2/1999 | Tanaka | 356/401 |
| 5,929,997 A | | 7/1999 | Lin | 356/401 |
| 5,936,711 A | * | 8/1999 | Miyai et al. | 250/548 |
| 5,978,069 A | * | 11/1999 | Kato | 355/53 |
| 5,985,764 A | | 11/1999 | Lin et al. | 438/692 |
| 6,141,108 A | * | 10/2000 | Kida et al. | 356/401 |
| 6,262,793 B1 | * | 7/2001 | Sasaya et al. | 355/53 |

* cited by examiner

Primary Examiner—Alan A. Mathews
(74) Attorney, Agent, or Firm—Allston L. Jones (57) ABSTRACT

A system and method for performing alignment of a substrate using alignment marks on the backside of a substrate supported by a movable chuck is disclosed. The system includes an imaging optical system arranged such that the movable chuck can position one end of the optical system either adjacent the front surface of the substrate or near the front surface but outside the perimeter of the substrate. In one embodiment, secondary optical systems are arranged within the chuck at the chuck perimeter so as to be in optical communication with corresponding alignment marks. The chuck is movable so that the imaging optical system can be placed in optical communication with the second optical system and image the alignment marks onto a detector. The detector converts the alignment mark images into digital electronic images, which are stored in a computer system and processed. The chuck then moves the substrate to exposure locations based on the result of processing the images.

17 Claims, 5 Drawing Sheets

BACKSIDE ALIGNMENT SYSTEM AND METHOD

Related Applications

The present application is related to commonly assigned co-pending U.S. patent application Ser. No. 09/855,485 entitled, "MACHINE-INDEPENDENT ALIGNMENT SYSTEM AND METHOD", filed on May 14, 2001.

FIELD OF THE INVENTION

The present invention pertains to alignment systems, and in particular to backside alignment systems and methods for substrate alignment in lithography systems.

BACKGROUND OF THE INVENTION

In semiconductor manufacturing, the processing steps for fabricating a semiconductor device (e.g., an integrated circuit) involve exposing a substrate, such a semiconductor wafer coated with photosensitive material, using a lithographic exposure system. This exposure requires aligning the substrate residing on a substrate stage (hereinafter, "chuck") to a reticle having a pattern of a particular device layer and residing on a reticle stage. To perform alignment, the lithographic system includes an alignment system, such as that disclosed in U.S. Pat. No. 5,621,813 (referred to hereinafter as "the '813 patent"), which patent is incorporated herein by reference. After alignment, the reticle is exposed to radiation to which the photosensitive coating is sensitive, to transfer the reticle pattern onto the wafer. This alignment and exposure can be performed on a variety of lithography systems such as step and repeat, projection, contact and proximity systems, for example. Typically, the first of such device layers is aligned to some marking on the wafer, for example, to a flat or notch, as is well known. Subsequent layers are then aligned relative to this first layer and/or to each other through the use of alignment marks printed in the kerf region, i.e., the region between exposure fields. Typical alignment marks include chevrons, squares, crosses and grouped lines of various orientation.

In some lithographic applications, such as micromachining of substrates in the production of pressure transducers, the three-dimensional nature the device being produced requires precise alignment of the structure from the frontside through to the backside of the substrate. In certain cases, the substrate is processed on one side, and then flipped over and processed on the opposite side to create the desired three-dimensional structure. In such cases, frontside and backside alignment must be performed to ensure the three-dimensional structure is properly aligned. For example, if there is a contact running through from the top to bottom sides of the substrate, it must be precisely aligned to the other elements in the device so that it can provide the necessary electrical contact.

There are devices in the prior art that are used to view a substrate from the backside. For example, U.S. Pat. No. 5,821,549 discloses acquiring from the backside of a substrate an IR optical microscope image of a feature formed therein, and aligning the image with a coordinate system of a milling system so that material can be milled away from the backside to expose the selected feature. However, this technique provides no way to align successive patterns on the front side using the marks on the backside.

U.S. Pat. No. 5,985,764 discloses a technique for viewing alignment marks from the backside of a substrate by coating the alignment marks on the frontside of the substrate with an IR-reflective coating. This technique is used to overcome obscuring effects on the alignment marks due to the topography of overlying layers from the various process steps. Unfortunately, the technique requires adding steps to the process for forming the device, which is undesirable.

U.S. Pat. No. 5,929,997 discloses a method for aligning a reticle with a semiconductor wafer that includes simultaneous viewing of the alignment marks on a reticle and on the backside of a wafer through the chuck supporting the wafer. However, the method is fairly complex in that the alignment light must pass through the reticle as well as through the wafer.

Accordingly, there is a need for a simple, robust backside alignment system that can quickly measure a variety of alignment sites on a substrate in order to quickly align a substrate so that it can be processed.

SUMMARY OF THE INVENTION

The present invention pertains to alignment systems, and in particular to backside alignment systems and methods for substrate alignment in lithography systems.

In particular, the present invention is a system and method for performing alignment of a substrate using alignment marks on the backside of a substrate supported by a movable chuck. The system includes an imaging optical system arranged such that the movable chuck can position one end of the optical system either adjacent the front surface of the substrate or near the front surface but outside the perimeter of the substrate.

In aspect of the invention, secondary optical systems are arranged within the chuck at the chuck perimeter so as to be in optical communication with corresponding alignment marks. The chuck is movable so that the imaging optical system can be placed in optical communication with the second optical system and image the alignment marks onto a detector. The detector converts the alignment mark images into digital electronic images, which are stored in a computer system. The chuck then moves the substrate to exposure locations based on the calculation.

In another aspect of the invention, a target on the chuck is used to align reticle targets ("keys") with the alignment marks on the substrate so that a reticle can be imaged onto a substrate using a lithography system having a projection lens. This is facilitated through the use of an alignment target placed on the chuck. A separate alignment system is used to acquire an image of the chuck target and determine the chuck position that aligns the chuck target to each of the reticle alignment key images imaged onto the chuck through projection lens. The chuck target is then moved to a position where it is aligned with the imaging optical system. The distance traveled locates the positions of the reticle alignment keys with respect to the backside alignment targets. These offsets are then used to calculate the positions of the chuck that result in the correct placement of the reticle alignment key images (and thus the reticle pattern) projected onto the substrate.

DETAILED DESCRIPTION OF THE INVENTION

The present invention pertains to alignment systems, and in particular to backside alignment systems and methods for substrate alignment in lithography systems.

In the Figures and in the description below, like reference numbers and symbols are used for like elements.

First Example Embodiment

Figure 1:
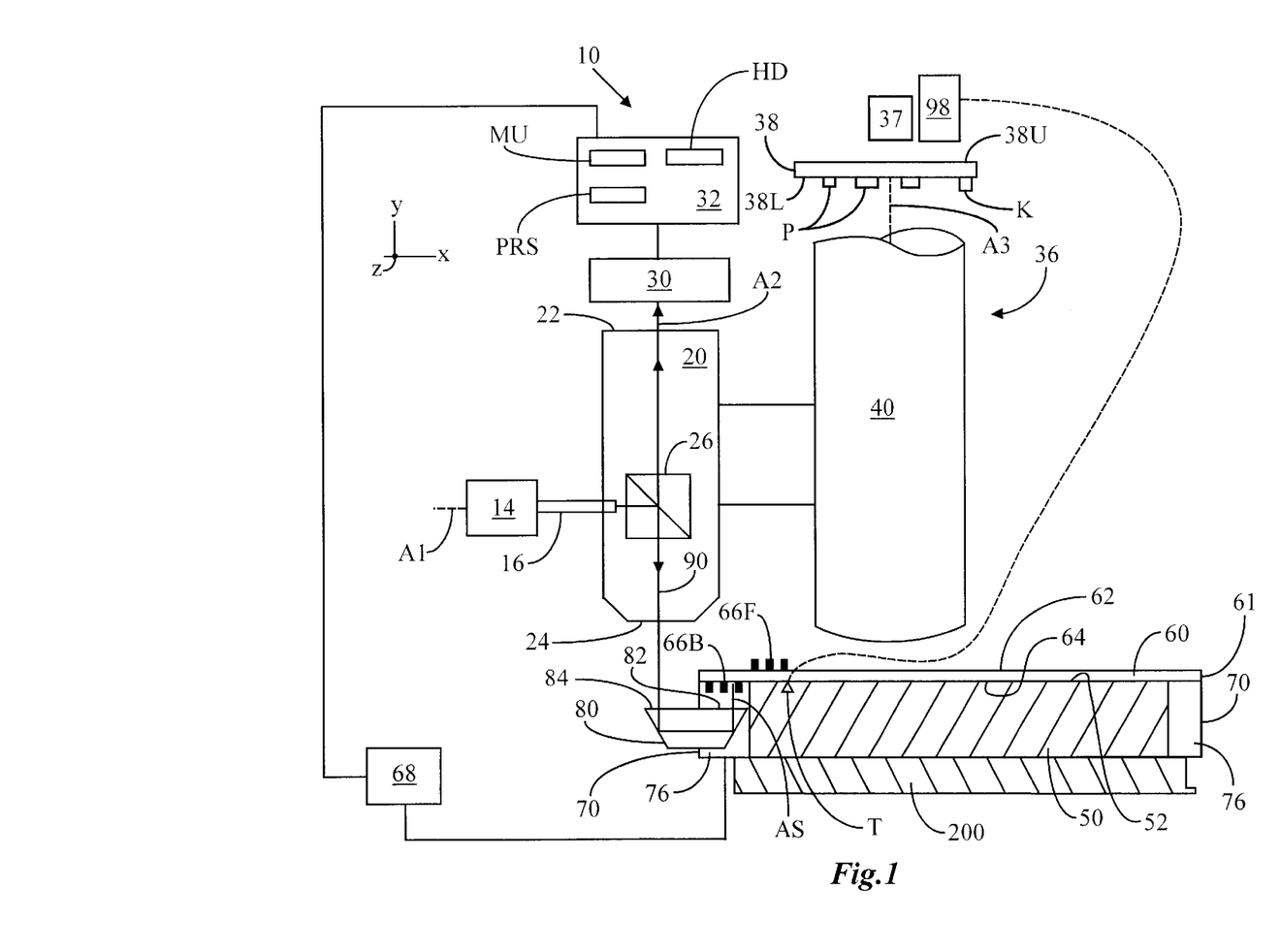
FIG. 1 is a schematic cross-sectional diagram of a first example embodiment of alignment system of the present invention, showing an off-axis imaging optical system in combination with a lithography system, for viewing backside alignment marks near the perimeter of the substrate.

With reference now to FIG. 1, there is shown a first example embodiment of the alignment system 10 of the present invention. System 10 includes a light source 14 arranged along a first axis A1. Light source 14 may be a visible-wavelength laser or photodiode and may be connected to an optical fiber 16, as shown. Further included in system 10 is an imaging optical system 20 arranged along a second axis A2 that is perpendicular to axis A1. Optical system 20 has first and second ends 22 and 24, and includes a beam splitter 26 at which axes A1 and A2 intersect. An exemplary imaging optical system is a microscope objective having sufficient working distance and that is corrected for the thickness of optical glass associated with a secondary optical system, described below.

Optical system 20 includes an image plane IP with an image field IF optically downstream from near second end 22. Adjacent second end 22 located at or near image plane IP is a detector 30, preferably in the form of a CCD camera. Connected to detector 30 is a computer system 32. Computer system 32 further includes a memory unit MU capable of storing information, such as digitized alignment pattern images, and a hard drive HD. Computer system 32 also includes pattern recognition software (PRS) (stored, e.g., in memory unit MU or residing on hard drive HD) for processing images of alignment marks imaged onto detector 20 by the alignment system optics, as described below. A technique for processing alignment mark images in performing alignment of a substrate in the present invention is described in U.S. patent application Ser. No. 09/855,485, entitled, "MACHINE-INDEPENDENT ALIGNMENT SYSTEM AND METHOD", filed on May 14, 2001, which patent application is incorporated herein by reference. Computer system 32 also includes a processor for processing information pertaining to alignment patterns, and executing the pattern recognition process based on instructions stored in memory unit MU or on hard drive HD. An exemplary computer system 32 is a Dell Workstation, available from Dell Computer, Inc., Austin, Tex.

System 10 is preferably mounted off-axis relative to a lithography system 36 having, in order along an axis A3, an illuminator 37, a reticle 38 and a projection lens 40. Reticle 38 includes an upper surface 38U and a lower surface 38L. The latter includes a fine pattern P, and a reticle alignment pattern or "keys" K. Projection lens 40 is used to form images of pattern P and alignment keys K (the latter being referred to herein as "reticle key images") on a substrate once the substrate is aligned. Systems 10 and 36 share a movable chuck 50 with an upper surface 52 for supporting a substrate 60 having a perimeter 61, a frontside 62 and a backside 64, and moving the substrate so that it can be precisely positioned relative to projection lens 40 and also optical system 20.

Substrate 60 includes alignment marks 66F on frontside 62 and alignment marks 66B on backside 64. In an example embodiment, alignment marks 66B are near perimeter 61. Alignment marks 66B may actually be alignment marks 66F in the case where the substrate is simply flipped over and replaced on chuck 50. Because of the use of PRS in computer system 32, alignment marks 66F and 66B can be essentially any pattern that can be digitally stored in computer system 32. Exemplary alignment marks 66F and 66B include boxes (i.e., squares or rectangles), lines, crosses, grouped lines, etc.

Systems 10 and 36 also share a chuck position and control system 68 operatively connected to chuck 50 and computer system 32 to measure the position of the chuck and coordinate the movements of the chuck in performing the necessary alignment measurements using system 10 for different alignment sites AS on the substrate associated with alignment marks 66B arranged at different locations on backside 66B.

Figure 2A:
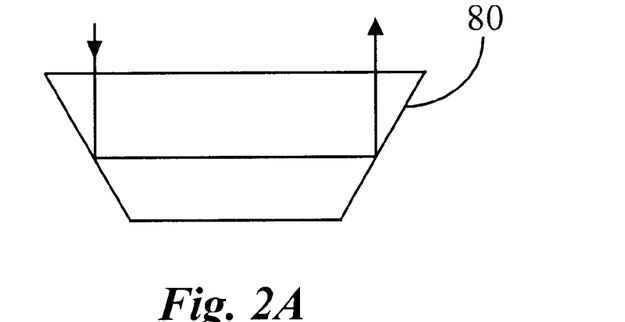
FIGS. 2A–2C are cross-sectional views of exemplary secondary optical systems incorporated into the chuck of FIG. 1.
Figure 2B:
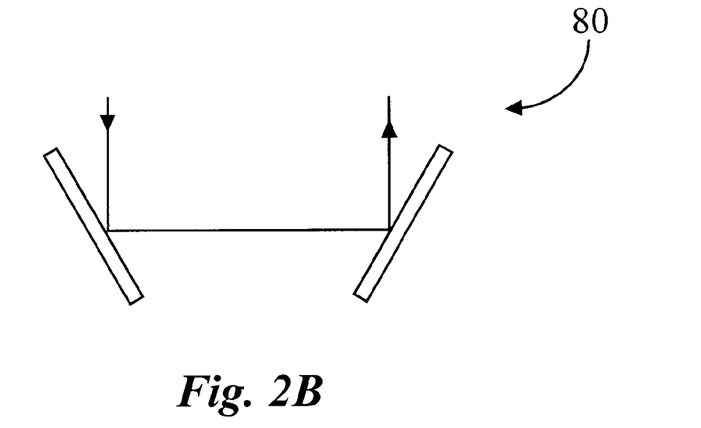
Figure 2C:
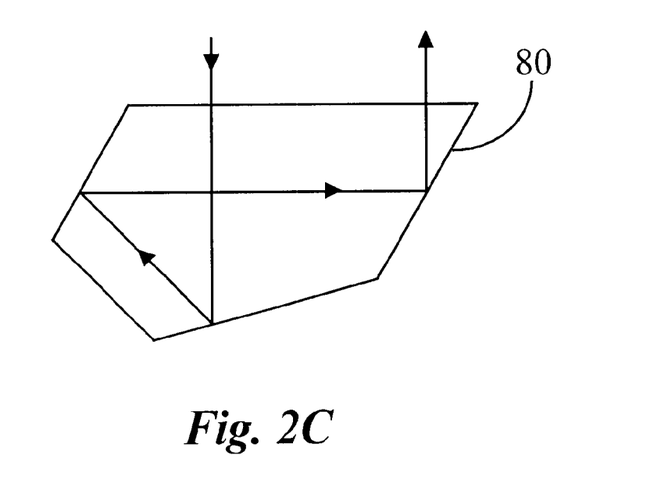

In the first exemplary embodiment of alignment system 10, chuck 50 includes a perimeter 70 with one or more cutout portions 76 sized to accommodate a folding (secondary) optical system 80, such as a prism or mirrors. Optical system 80 has a first surface portion 82, which is arranged adjacent substrate backside 64, and a second surface portion 84 extending beyond perimeter 70. With reference to FIGS. 2A–2C, exemplary optical systems 80 include a right-angled apex-truncated prism (FIG. 2A), a two-mirror system (FIG. 2B) and a combination Amici-prism/right-angle prism (FIG. 2C). In a preferred embodiment, an optical system 80 is fixed within each cutout portion 76. Optical systems 80 provide access by optical system 20 to backside alignment marks 66B when optical system 20 is optically coupled to optical system 80

Thus, in operation, movable chuck 50 is positioned such that end 24 of optical system 20 is placed adjacent second surface portion 84 of optical system 80 and in optical communication (i.e., optically coupled) therewith. Light 90 from light source 14 is reflected by beam splitter 26 and is directed along optical axis A2 in the negative Y-direction. Light 90 then passes from end 24 of optical system 20 and enters optical system 80 at surface portion 84. Light 90 is reflected so as to exit surface portion 82 and illuminate alignment marks 66B. Light 90 is then reflected by alignment mark 66B and backside 64 back over the optical path defined by axis A2 to beam splitter 26. Light 90 passes through beam splitter 26 and continues along axis A2. Imaging optical system 20 is designed to image alignment mark 66B onto detector 30. Detector 30 converts the alignment mark image into an electrical signal, which is provided in digital form to computer 32 and stored in memory unit MU. Computer 36 is capable of processing the image of the alignment mark, including computing the position of the alignment mark image in image field IF of the imaging optical system.

Once an alignment image is electronically stored on memory unit MU, control system 68 initiates movement of movable chuck 50 to position another optical system 80 arranged in a different region of chuck 50, adjacent to optical system 20 and the process repeated. Once enough measurements are taken (e.g., four different alignment mark sites AS), alignment calculations can then be performed in computer system 32 using the PRS stored therein, and the substrate properly positioned relative to projection lens 40 for exposure. The relative position of projection lens 40 to imaging optical system 20 is predetermined, and this information is stored in computer system 36.

The calculation of the correct stage positions to align the reticle key images projected onto the top of the substrate to the alignment marks on the backside of the substrate requires knowledge of the offsets between the backside alignment marks and the position of the reticle key images. These offsets are determined in a calibration procedure that uses a target T attached to the chuck. A separate alignment system 98 determines the chuck position that aligns chuck target T to each of the reticle alignment key images imaged onto the chuck through projection lens 40. Chuck target T is then moved to a position where it is aligned with imaging optical system 20. The distance traveled locates the positions of the reticle alignment keys with respect to the backside alignment targets. These offsets are then used to calculate the positions of chuck 50 that will result in the correct placement of the reticle alignment key images (and thus reticle pattern P) projected onto substrate 60. The calculation is preferably carried out in computer system 32.

Second Example Embodiment

Figure 3:
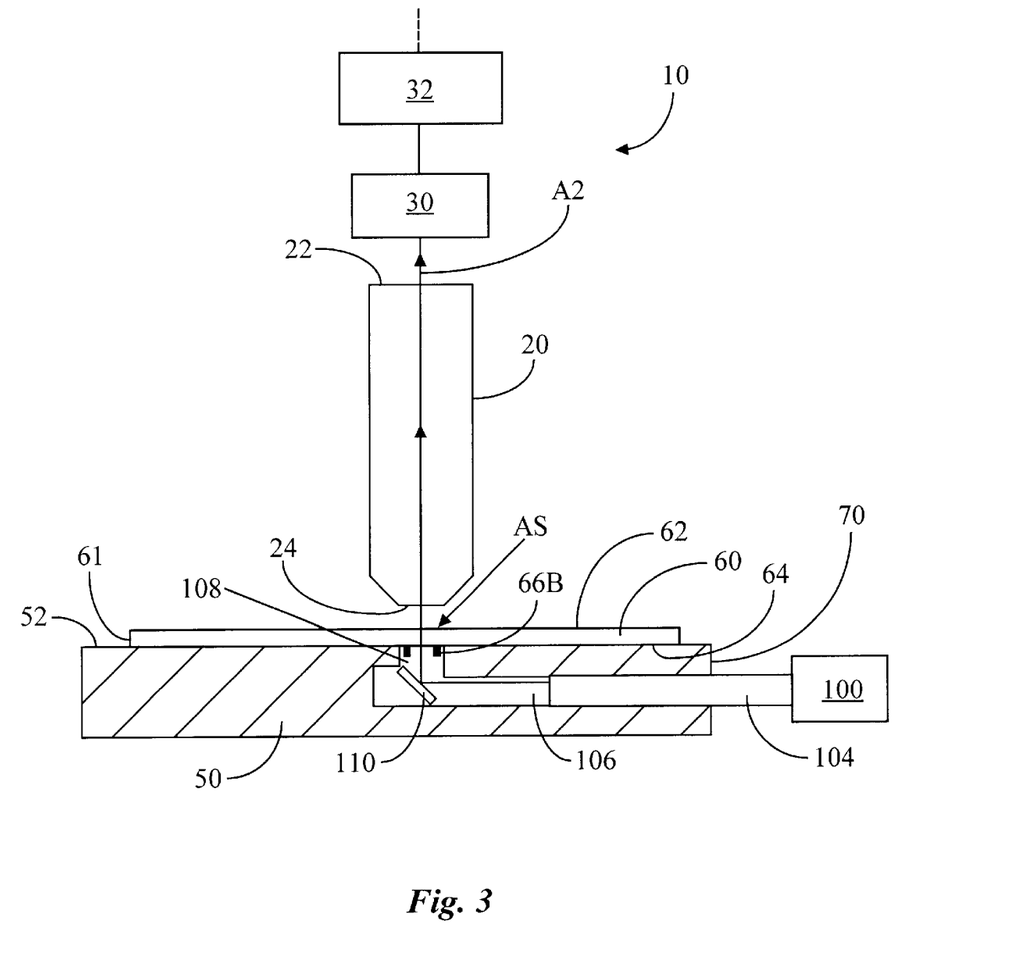
FIG. 3 is a schematic cross-sectional diagram of a second example embodiment of the alignment system of the present invention similar to that of FIG. 1, wherein the backside alignment marks are illuminated from the backside and imaged through the frontside.

With reference now to FIG. 3, there is shown a second example embodiment of alignment system 10 similar to that shown in FIG. 1, but without beam splitter 26 in optical system 20, and without light source 14. Also, optical system 20 is designed to operate at a wavelength of light capable of being transmitted by substrate 60. In the case where substrate 60 is a silicon wafer, the transmissible wavelengths include the infra-red. In the system 10 of FIG. 3, a light source 100 capable of emitting substrate-transmissible wavelengths (such as infra-red) is connected to optical fiber 104 capable of transmitting the emitted light, and that extends inwardly from perimeter 70 into chuck 50 into a cavity 106 formed. Cavity 106 includes an aperture 108 open to chuck upper surface 52.

In this second example embodiment, alignment marks 66B are illuminated by light from light source 100 via optical fiber 104. A fold mirror 110 arranged in cavity 106 may be used to reflect the light emanating from optical fiber 104 upward toward alignment mark 66B. The light passes from backside 64 through to frontside 62 of the substrate and is collected by imaging optical system 20 and an image of alignment mark 66B is formed onto detector 30.

A plurality of cavities 106 and associated optical fibers 104 and light sources 100 are preferably arranged in chuck 50 to provide a plurality of measurements at a corresponding plurality of alignment sites AS each having an alignment mark 66B. Naturally, alignment marks 66B at alignment sites AS need to be formed on substrate 60 so that they nominally align with openings 108 in chuck 50. This second example embodiment is particularly useful where the alignment sites are interior to the substrate and chuck rather than being adjacent perimeter 70.

Figure 4:
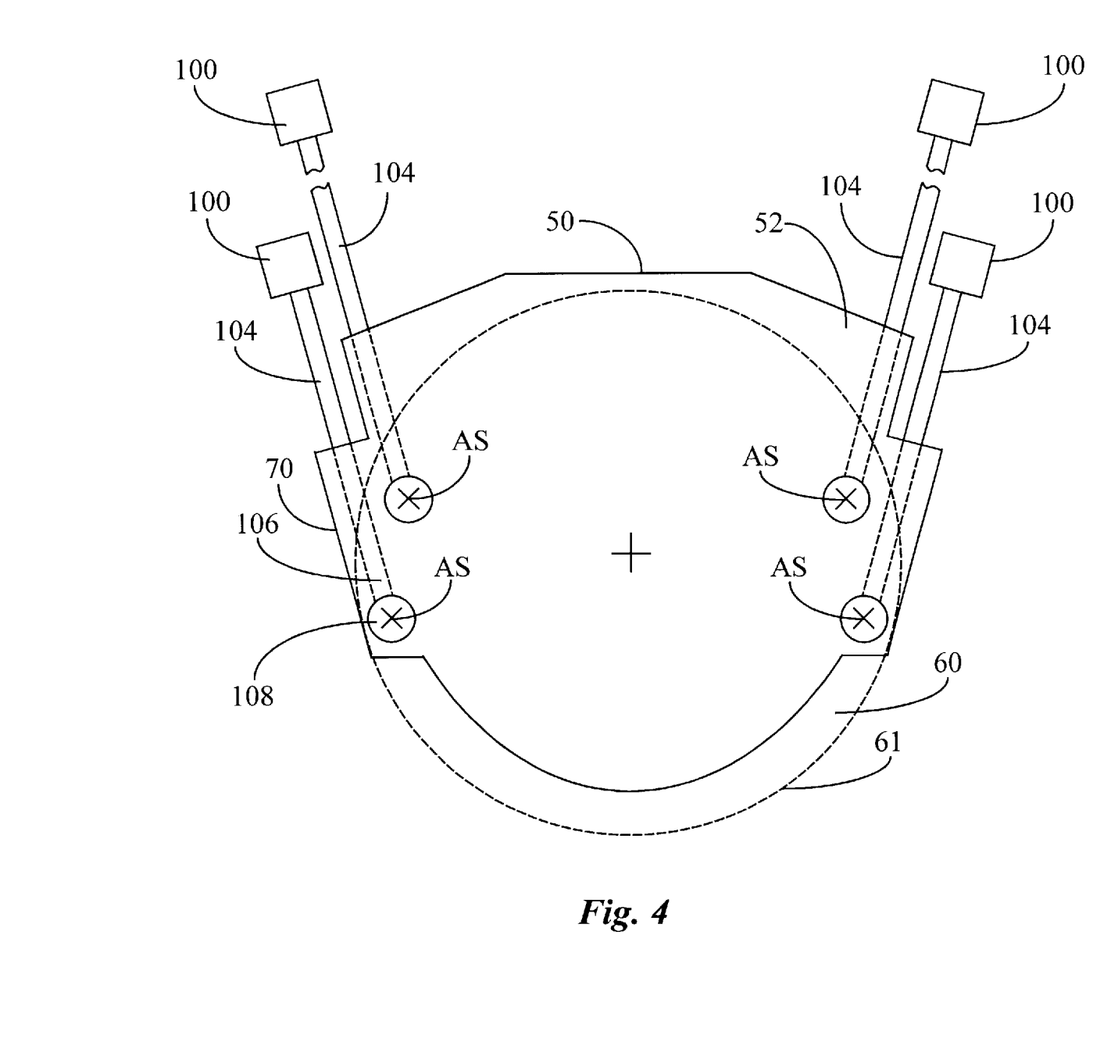
FIG. 4 is a plan view of the chuck for the second example embodiment of the alignment system of the present invention, illustrating exemplary locations for acquiring images of the backside alignment marks using light sources arranged outside of the chuck and optical fibers connected to the chuck, with the substrate perimeter illustrated by the dashed line.

In operation, chuck 50 is moved between alignment sites AS (i.e., the location of alignment marks 66B) until a desired number of alignment measurements have been taken. FIG. 4 is a plan view of an exemplary chuck design showing four optical fibers 104, the associated light sources 100, and apertures 108 that align with alignment sites AS. The outline of substrate 60 is shown as a dashed line, along with the alignment sites AS.

Third Example Embodiment

Figure 5:
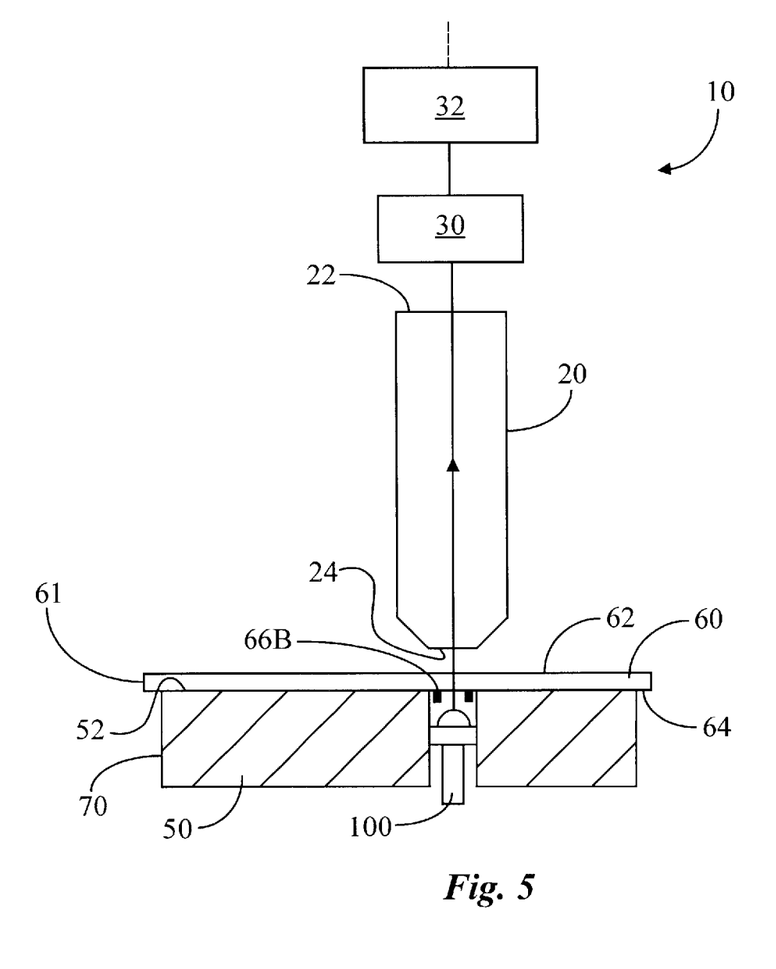
FIG. 5 is a schematic cross-sectional diagram of a third example embodiment of the alignment system of the present invention similar to that of FIG. 3, wherein the backside alignment marks are illuminated from the backside and imaged through the frontside using light sources within the chuck.

With reference now to FIG. 5, a third example embodiment of alignment system 10 similar to the second example embodiment of FIG. 3 is shown. Instead of having an optical fiber to relay light from light source 100, the light source is placed directly into a cavity 120 formed in chuck 50. Light source 100 then directly illuminates alignment mark 66B, and the light passing from backside 64 to frontside 62 is imaged from the frontside onto detector 30 by optical system 20. A plurality of cavities 120 and associated light sources 100 are preferably arranged in chuck 50 to provide for a plurality of measurement sites for a plurality of alignment sites AS each having an associated alignment mark 66B. Naturally, alignment marks 66B need to be formed so that alignment sites AS on the substrate nominally align with openings 108 in chuck 50. This second example embodiment is useful where the alignment sites are interior to the substrate and chuck rather than being adjacent perimeter 70. In operation, chuck 50 is moved between alignment sites AS until a desired number of alignment measurements have been taken.

Backside Alignment Method

The present invention also includes a method performing alignment of a substrate with respect to a reference position. The method includes establishing the precise location of movable chuck 50 relative to a reference position (.e.g., the optical axis A3 of the projection lens or another part of lithography system 36, such as the reticle image (not shown)) by performing a chuck location calibration. This may be accomplished by utilizing a chuck position and control system 68 electrically connected to computer system 32, and an in operable communication with chuck 50. Chuck position and control system 68 includes, in an exemplary embodiment, an interferometer capable of measuring the position of chuck 50 to within 0.1 micron. In another exemplary embodiment, chuck 50 is attached to a stage 200 capable of moving the chuck in six degrees of freedom. Part of the chuck location calibration process includes determining the position of the chuck relative to imaging optical system 20.

Also stored in computer system 32 (e.g., in memory unit MU or hard drive HD) are one or more digitized alignment mark images for use with the PRS. Use of the digitized alignment marks allows for a particular known alignment mark to be imaged with a higher signal-to-noise ratio (SNR) by processing (e.g., by filtering) the image of the alignment mark.

Once the chuck location calibration is performed and the chuck location information stored in computer system 32, chuck 50 is moved so that alignment marks 66B at the different alignment sites AS can be viewed. With regard to system 10 of FIG. 1, chuck 50 is moved so that optical imaging system 20 is optically coupled to one of optical systems 80 so as to image the corresponding alignment mark 66B. With regard to systems 10 of FIGS. 3 and 5, chuck 50 is moved via chuck position and control system 68 to the predetermined alignment site AS so that imaging optical system 20 can capture images of the alignment marks associated therewith via detector 30.

Computer 32 then processes the digitized images of alignment marks 66B (e.g., using the PRS) for each alignment sites AS and identifies a location associated with each alignment mark as indicated by the centroid or other position on the mark. The identified location is then compared to the measured location (i.e., the chuck location reference data) stored in computer system 32 as determined by the chuck location calibration. Once the position of alignment marks 66B are compared to the reference data, the amounts of X and Y movement, and the associated rotation around the Z axis needed to achieve proper alignment of the substrate for subsequent processing with lithography system 36 are calculated. Computer system 32 then sends an electronic signal to chuck position and control system 180 to effectuate movement of the chuck to an alignment location, i.e., a location that provides the proper alignment of the substrate for the task at hand. An example task might be patterning substrate surface 62 with images provided by projection lens 40 as one of the steps in forming a semiconductor device.

As discussed above, the method can optionally include the use of a chuck target and a separate alignment optical system to facilitate the determination of the offsets between the backside alignment marks and the position of the reticle key images.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. An alignment system for aligning a substrate having a frontside and a backside, with the backside having alignment marks thereon, the alignment system comprising:
    a light source to generate light along a first axis;
    an imaging optical system having an imaging field and first and second ends, and arranged along a second optical axis perpendicular to the first axis and including a beam splitter arranged at an intersection of the first and second axes, wherein the first and second axes do not intersect the substrate;
    a movable chuck having a perimeter with a plurality of secondary optical systems arranged thereon so as to be in optical communication with the backside of the substrate and the alignment marks, the chuck movable to place the imaging optical system in optical communication with each secondary optical system;
    a detector arranged adjacent the first end of the imaging optical system to receive an image of the alignment marks formed by the imaging optical system, and convert the image into an electrical signal corresponding to an electronic image; and
    a computer system, electrically connected to the detector, and that includes pattern recognition software to process electronic images to identify and locate each alignment mark.

2. A system according to claim 1, wherein the computer system contains alignment mark position information and information on the location of reticle keys images of a reticle to be imaged and reticle key image offsets from the center of the alignment system to align the reticle pattern to be projected on the top surface of the wafer with the backside alignment marks.

3. An alignment system according to claim 1, wherein light source generates visible-wavelength light.

4. An alignment system according to claim 1, wherein the secondary optical system includes either a prism or a pair of folding mirrors.

5. An alignment system according to claim 1, further including a chuck position and control system operatively connected to the chuck and electrically connected to the computer system, to measure the position and coordinate the movement of the chuck.

6. An alignment system according to claim 1 wherein the imaging optical system is a microscope objective.

7. An alignment system according to claim 6, wherein the microscope objective is mounted off-axis with respect to a projection lens used to form images on the substrate.

8. An alignment system according to claim 1, wherein the computer system includes a memory unit for storing the electronic images and a processor for processing the electronic images.

9. An alignment system according to claim 1, wherein the computer system includes a stored digitized image of the alignment mark to compare to the detected alignment mark in order to perform pattern recognition on the detected alignment mark and to compute the position of the alignment mark in the field of the imaging optical system.

10. A method of performing alignment of a substrate residing on a chuck for exposure by a projection lens projecting an image of a reticle having a pattern and alignment patterns, the substrate having a perimeter, a frontside and a backside, with a plurality of alignment marks arranged on the backside near the perimeter, the method comprising the steps of:
    a) measuring an offset between the reticle alignment patterns imaged through the projection system and an axis of an imaging optical system;
    b) storing the offset information in a computer system;
    c) acquiring images of the alignment marks with the imaging optical system by optically coupling the imaging optical system to a secondary optical system arranged on the perimeter of the chuck and in optical communication with the alignment marks.

11. A method according to claim 10, wherein determining the location for each alignment mark includes performing pattern recognition and pattern matching to ascertain a position for the alignment mark.

12. A method according to claim 10, further includes locating a target on the chuck with respect to the imaged reticle patterns as well as the location of the chuck target with respect to the imaging optical system for determining an offset backside alignment marks and the position of reticle key images.

13. A method according to claim 12, wherein the imaging optical system is an off-axis microscope.

14. The method of claim 10, further including the steps of:
    d) storing the acquired images as electronic images in the computer system;
    e) determining a location for each of the alignment marks; and
    f) using the determined location for each alignment mark and the offset information to compute chuck locations that will register the imaged reticle alignment patterns with the backside alignment marks.

15. An apparatus for facilitating alignment of a substrate with respect to a reticle, the apparatus comprising:
- a chuck body having a perimeter that defines one or more cut-out portions;
- a folding optical system fixed within each cut-out portion, wherein each optical system has a first surface portion disposed to be adjacent a backside of the substrate when mounted on the chuck body, and a second surface portion that extends beyond the chuck body perimeter and the substrate.

16. The apparatus of claim 15, wherein the chuck body is movable so as to place one of the second surface portions in communication with an imaging optical system.

17. The apparatus of claim 15, wherein the folding optical systems are formed from an optical system in the group of optical systems consisting of: a right-angled apex-truncated prism, a two-mirror system, and a combination Amici-prism/right-angle prism.

* * * * *